(12) United States Patent
Kato

(10) Patent No.: US 10,021,326 B2
(45) Date of Patent: Jul. 10, 2018

(54) SOLID-STATE IMAGE SENSOR INCLUDING PIXELS FOR DETECTING FOCUS USING A DIFFERENCE IN INTENSITY BETWEEN LIGHTS

(71) Applicant: CANON KABUSHIKI KAISHA, Tokyo (JP)

(72) Inventor: Taro Kato, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 32 days.

(21) Appl. No.: 15/175,529

(22) Filed: Jun. 7, 2016

(65) Prior Publication Data

US 2016/0366355 A1  Dec. 15, 2016

(30) Foreign Application Priority Data

Jun. 11, 2015 (JP) .................................. 2015-118578

(51) Int. Cl.
| | |
|---|---|
| H04N 5/335 | (2011.01) |
| H04N 5/369 | (2011.01) |
| H04N 5/232 | (2006.01) |
| H04N 9/04 | (2006.01) |

(52) U.S. Cl.
CPC ....... *H04N 5/3696* (2013.01); *H04N 5/23212* (2013.01); *H04N 9/045* (2013.01)

(58) Field of Classification Search
CPC .................................................... H04N 5/3696
See application file for complete search history.

(56) References Cited

U.S. PATENT DOCUMENTS

| | | | |
|---|---|---|---|
| 2009/0278966 A1* | 11/2009 | Kusaka | G02B 7/36 348/294 |
| 2011/0249156 A1* | 10/2011 | Goto | G02B 27/64 348/272 |
| 2015/0084146 A1* | 3/2015 | Kusaka | H01L 27/14621 257/432 |

FOREIGN PATENT DOCUMENTS

| | | |
|---|---|---|
| JP | 2009-105358 A | 5/2009 |
| JP | 2012-211942 A | 11/2012 |
| JP | 2014-107594 A | 6/2014 |

* cited by examiner

*Primary Examiner* — Gary C Vieaux
(74) *Attorney, Agent, or Firm* — Canon U.S.A., Inc. IP Division

(57) ABSTRACT

A solid-state image sensor includes a first pixel for detecting focus, a second pixel disposed adjacent to the first pixel, a third pixel disposed adjacent to the first pixel, and a first light reflecting member disposed between the first pixel and the third pixel. The first pixel includes a plurality of photoelectric conversion units. When a second light reflecting member is disposed between the first pixel and the second pixel, the width in a predetermined direction of the first light reflecting member is larger than the width in a predetermined direction of the second light reflecting member.

8 Claims, 18 Drawing Sheets

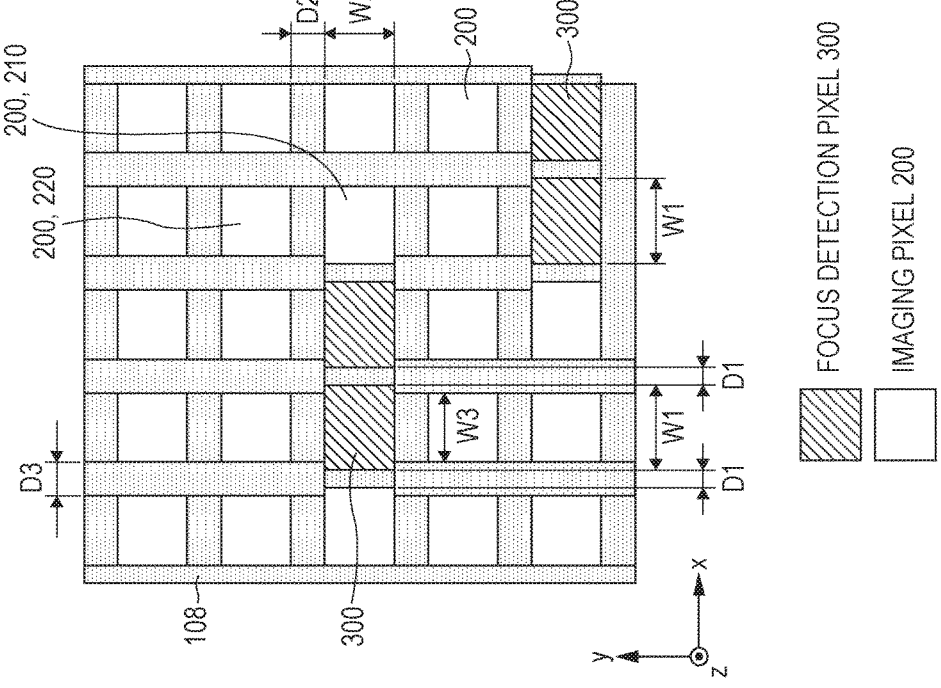
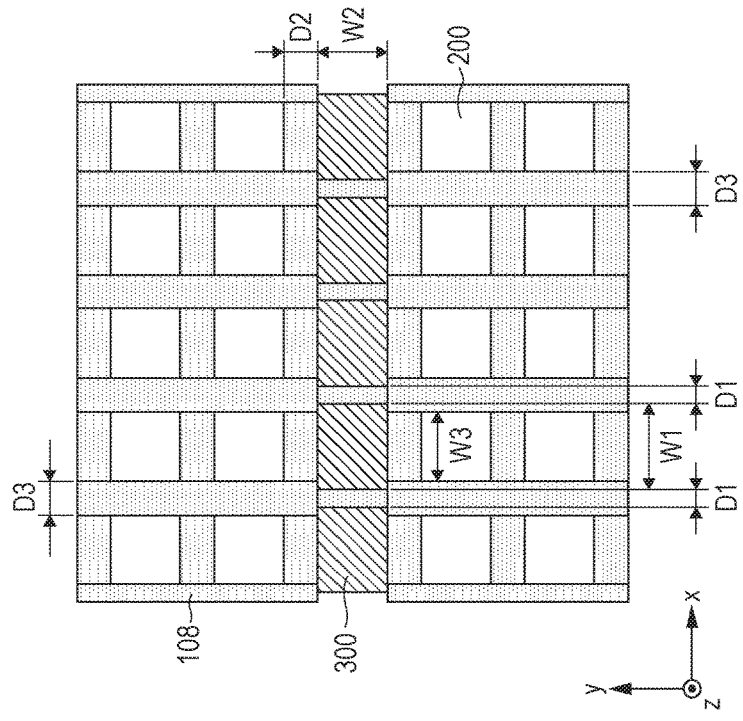

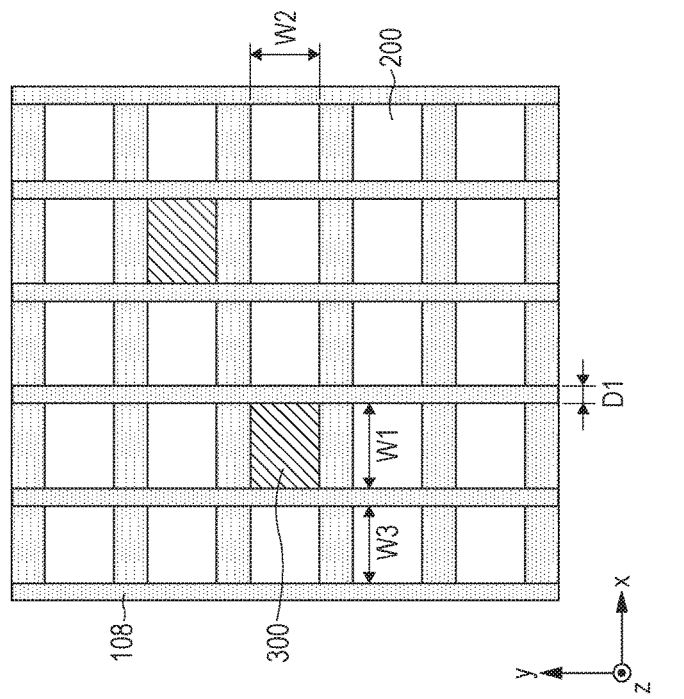
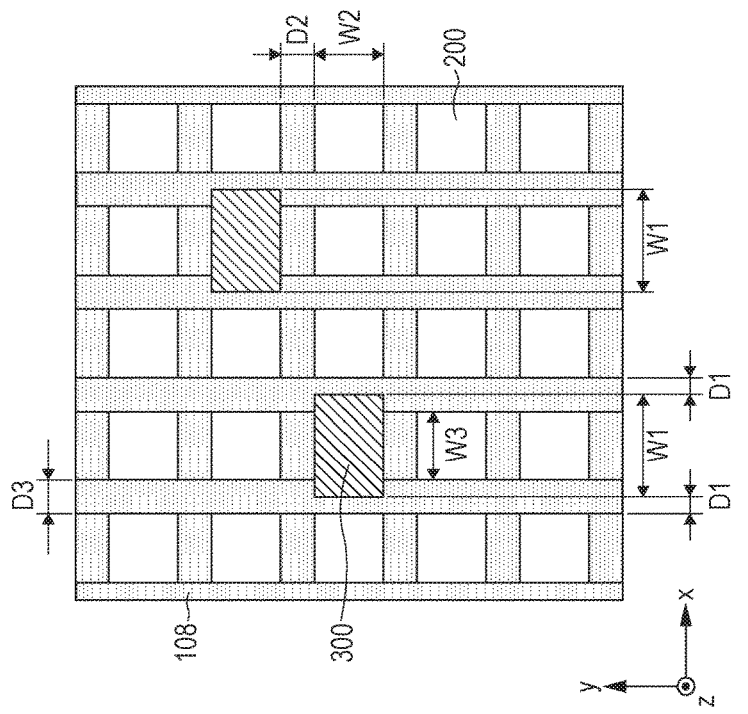

FIG. 8
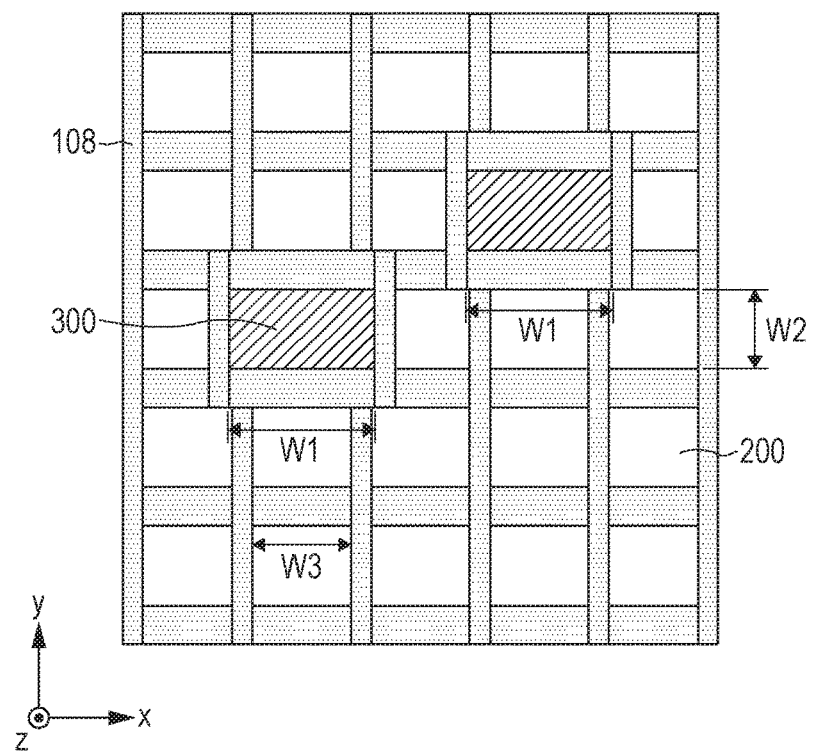
 FOCUS DETECTION PIXEL 300
 IMAGING PIXEL 200

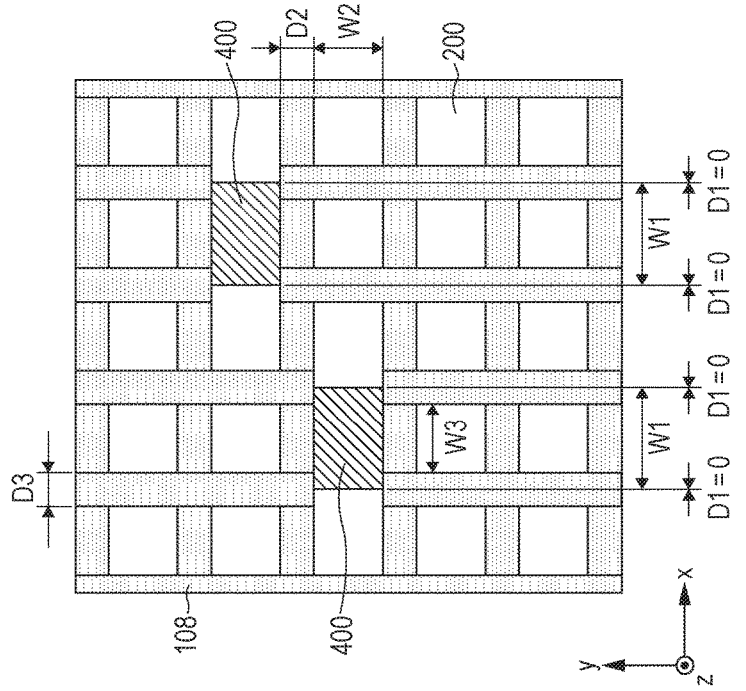
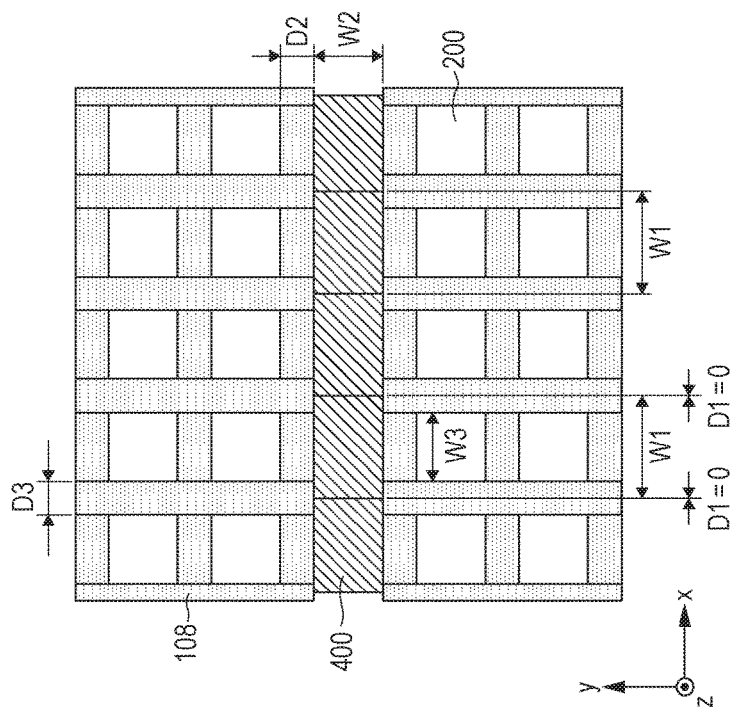

FIG. 12
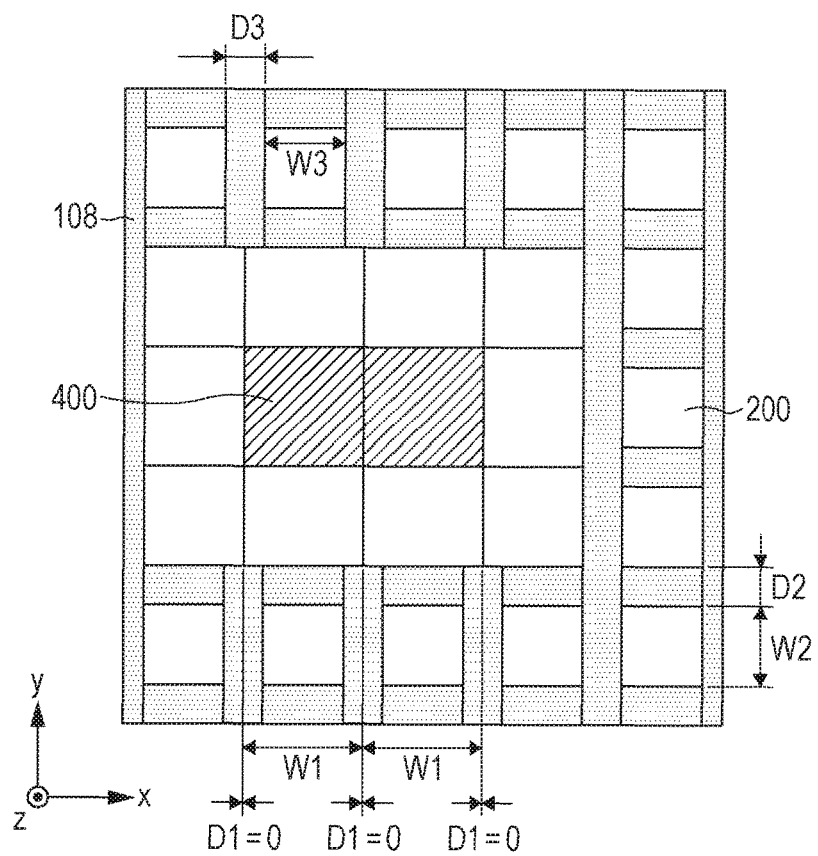
 FOCUS DETECTION PIXEL 400
 IMAGING PIXEL 200

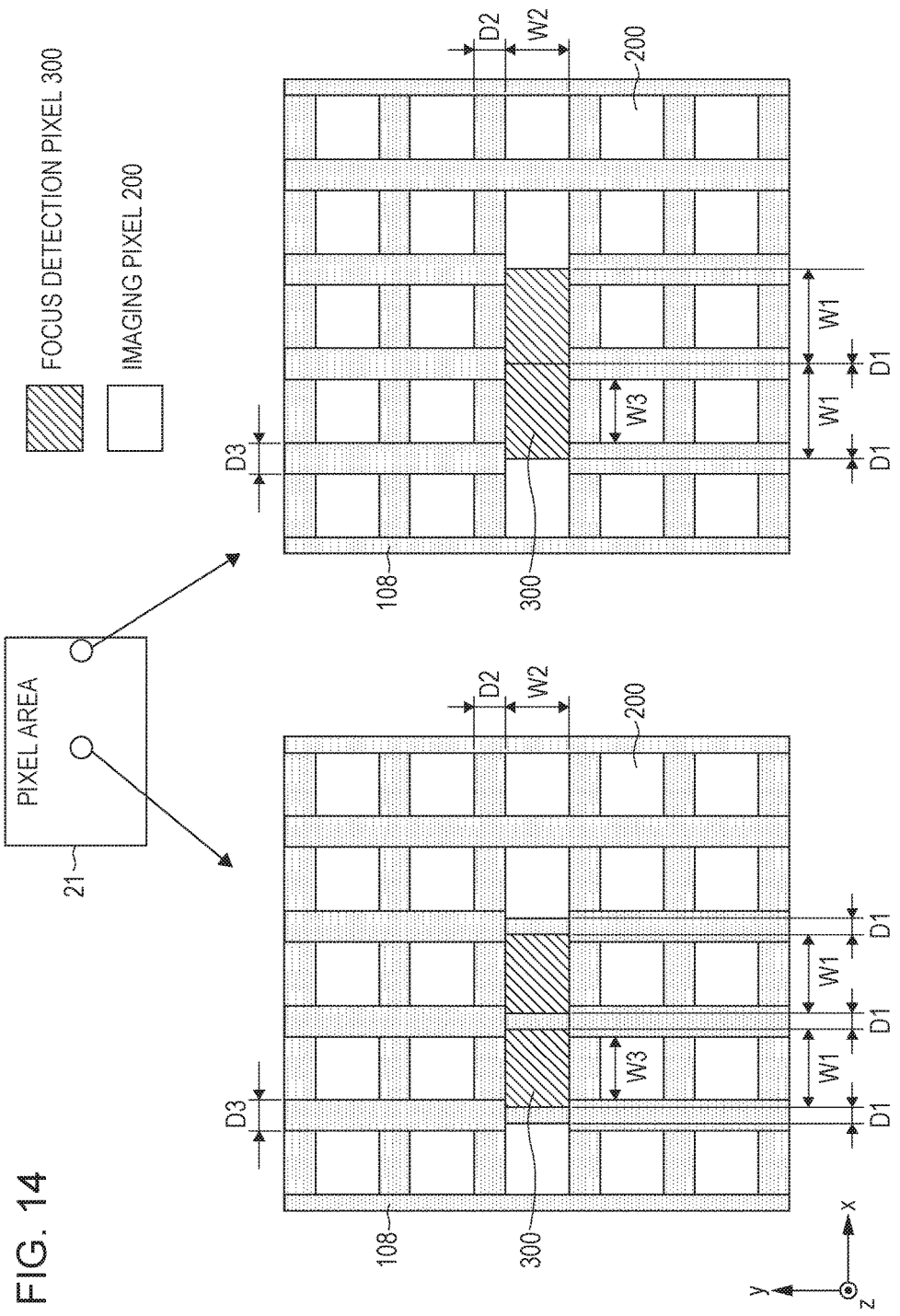

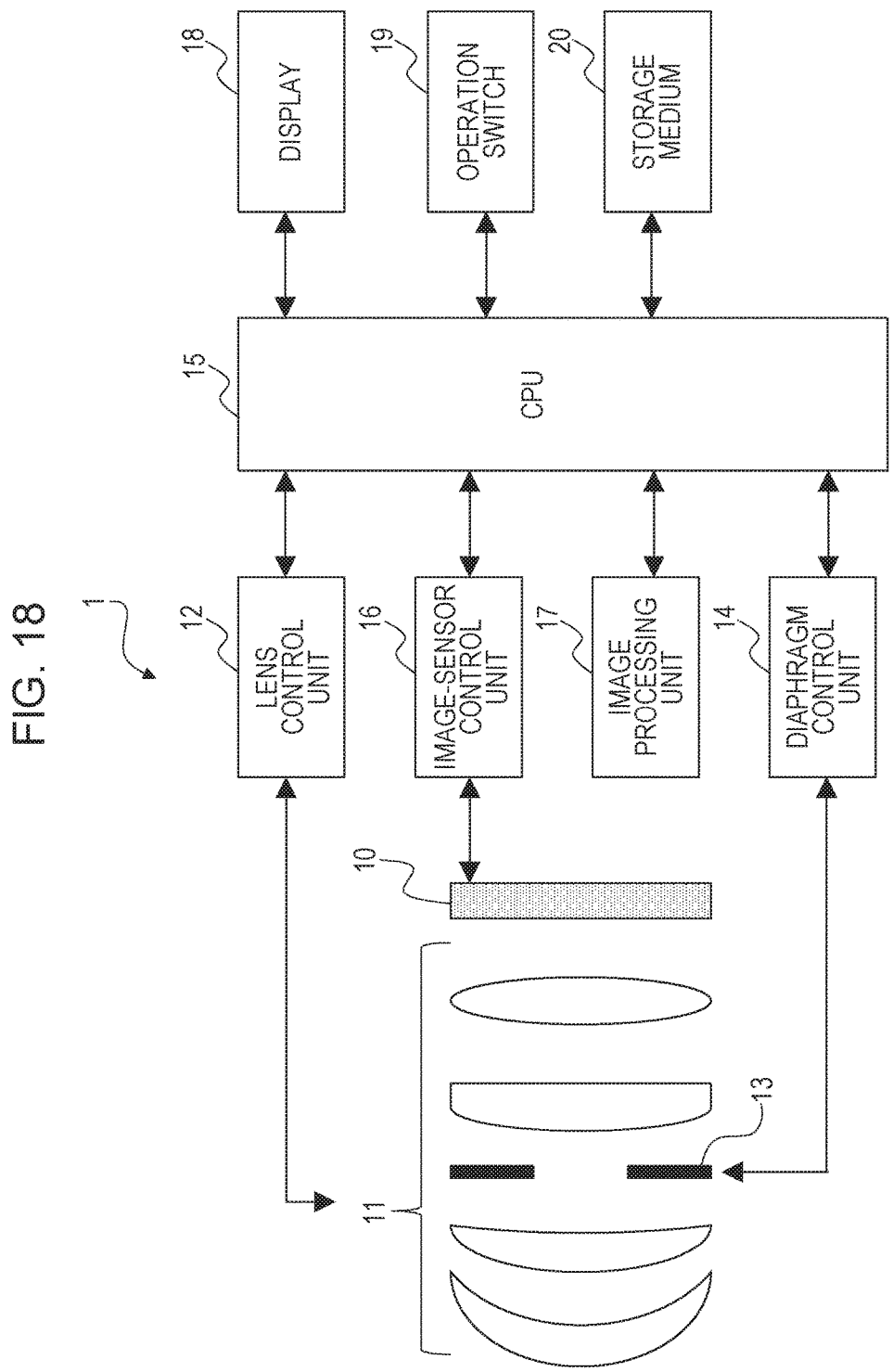

US 10,021,326 B2

SOLID-STATE IMAGE SENSOR INCLUDING PIXELS FOR DETECTING FOCUS USING A DIFFERENCE IN INTENSITY BETWEEN LIGHTS

BACKGROUND OF THE INVENTION

Field of the Invention

The present invention relates to solid-state image sensors including focus detection pixels.

Description of the Related Art

In recent years, image capturing apparatuses, such as video cameras and electronic still cameras, have become widely available. These cameras use a charge-coupled device (CCD) image sensor or a complementary metal-oxide semiconductor (CMOS) image sensor. Furthermore, focus detection pixels having an autofocus function for automatically adjusting focus during image capture have become widely available. For example, some image capturing apparatuses detect focus by phase difference detection using pixels for detecting focus in which two or more photoelectric conversion units are disposed. Another example is disclosed in Japanese Patent Laid-Open No. 2009-105358, in which a light shielding portion is disposed on a photoelectric conversion unit to selectively receive light on the photoelectric conversion unit to detect focus.

In Japanese Patent Laid-Open No. 2009-105358, the configuration of focus detection pixels and the configuration of focus detection pixels and imaging pixel are not under sufficient study. Accordingly, the present invention provides a solid-state image sensor in which the performance of the sensor is improved from the image sensor disclosed in Japanese Patent Laid-Open No. 2009-105358.

SUMMARY OF THE INVENTION

The present invention provides a solid-state image sensor including a pixel area in which a plurality of pixels are disposed in a two dimensional form. The image sensor includes a first pixel for detecting focus, a second pixel disposed adjacent to the first pixel along the first direction, a third pixel disposed adjacent to the first pixel along a second direction perpendicular to the first direction, a first light reflecting member disposed between the first pixel and the third pixel and extending in the first direction, and a second light reflecting member disposed between the first pixel and the second pixel and extending in the second direction. The first pixel includes a plurality of photoelectric conversion units disposed in a first direction. A width in the second direction of the first light reflecting member is larger than a width in the first direction of the second light reflecting member.

Further features of the present invention will become apparent from the following description of exemplary embodiments with reference to the attached drawings.

BRIEF DESCRIPTION OF THE DRAWINGS

FIG. 6A is a plan view of focus detection pixels according to the second embodiment.

FIG. 6B is a plan view of focus detection pixels according to the second embodiment.

FIG. 7A is a plan view of focus detection pixels according to the second embodiment.

FIG. 7B is a plan view of focus detection pixels according to the second embodiment.

FIG. 8 is a plan view of focus detection pixels according to the second embodiment.

FIG. 11A is a plan view of focus detection pixels according to the third embodiment.

FIG. 11B is a plan view of focus detection pixels according to the third embodiment.

FIG. 12 is a plan view of focus detection pixels according to the third embodiment.

FIG. 14 is a plan view of focus detection pixels according to the fourth embodiment.

FIG. 18 is a diagram illustrating the configuration of an image capturing system according to an embodiment of the present invention.

DESCRIPTION OF THE EMBODIMENTS

In first and second adjacent focus detection pixels, light incident on the micro lens of the first focus detecting pixel is sometimes detected as stray light in the second focus detecting pixel. Therefore, to reduce mixture of colors between the pixels, a light reflecting member that reflects the light incident on the micro lens may be disposed between the color filter of the first focus detecting pixel and the color filter of the second focus detecting pixel. However, the inventor found that such a light reflecting member disposed to reduce mixture of colors can degrade the focus detection performance. The present invention can be applied not only to solid-state image sensors in which a light shielding member is disposed on a photoelectric conversion unit to selectively receive light and which detect focus using the selectively received light but also to solid-state image sensors that detect focus using a difference in intensity between lights received by two photoelectric conversion units.

First Embodiment

Figure 1:
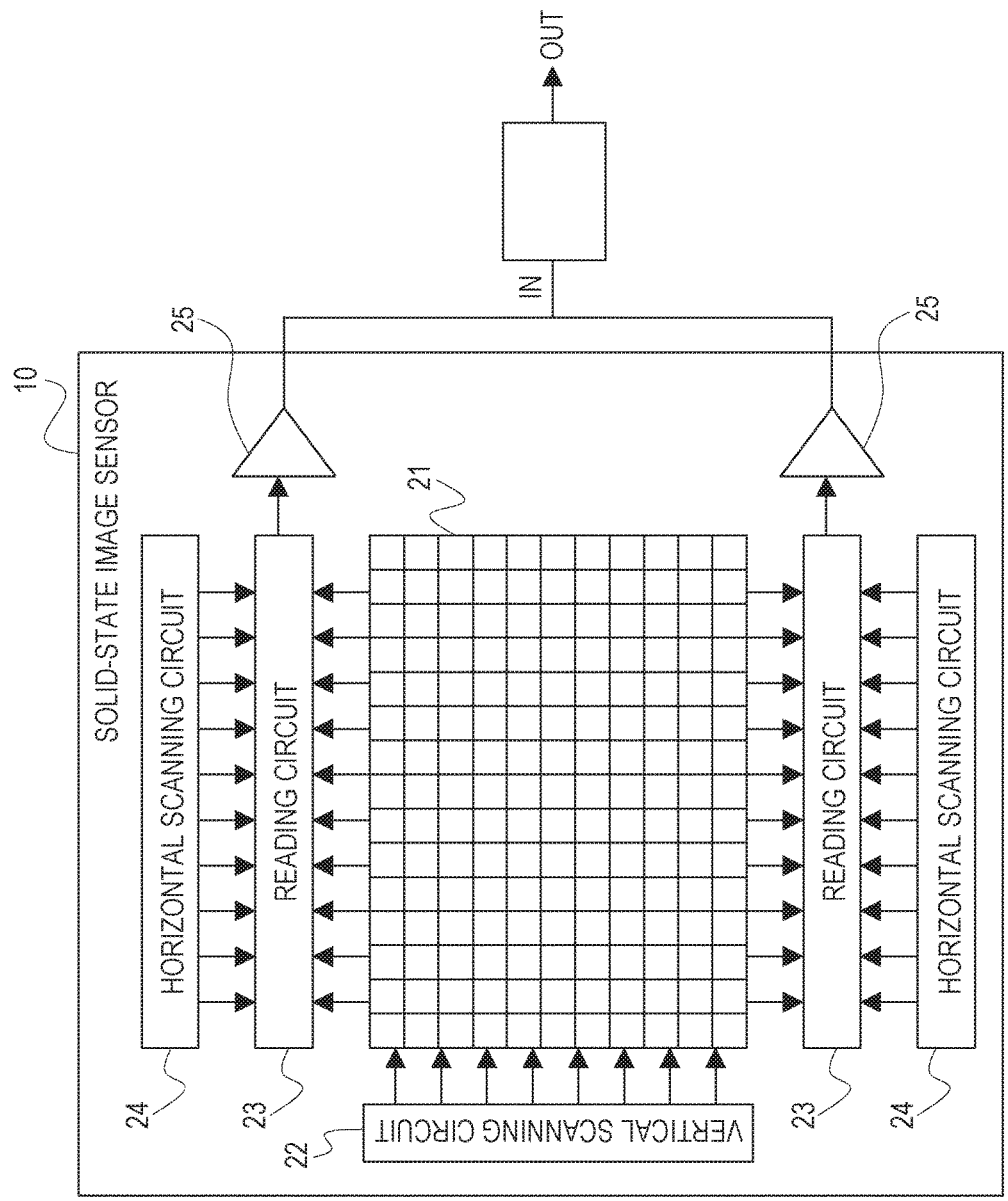
FIG. 1 is a block diagram of a solid-state image sensor according to an embodiment of the present invention.

FIG. 1 is a block diagram of a solid-state image sensor 10 including focus detection pixels according to an embodiment of the present invention. The solid-state image sensor 10 includes a pixel area 21, a vertical scanning circuit 22, two reading circuits 23, two horizontal scanning circuits 24, and two output amplifiers 25. The area other than the pixel area 21 is a peripheral circuit area. The pixel area 21 includes many imaging pixels in a two-dimensional form.

The peripheral circuit area includes the reading circuits 23 in which signals read from the pixels of a row selected by the vertical scanning circuit 22 through a vertical signal line are amplified or added. The reading circuits 23 have a column amplifier, a correlated double sampling (CDS) circuit, and an adding circuit. The horizontal scanning circuits 24 generate signals for reading signals based on pixel signals from the reading circuits 23 in sequence. The output amplifiers 25 amplify signals of columns selected by the horizontal scanning circuits 24 and output the signals.

Figure 2A:
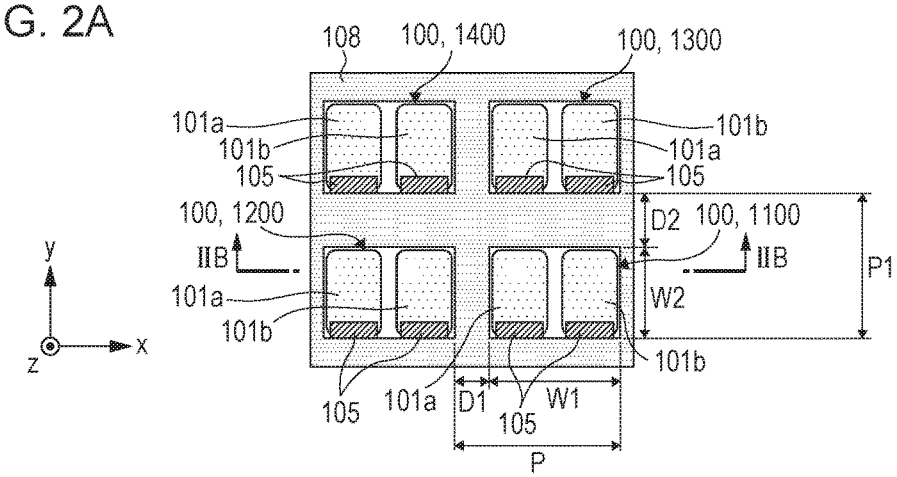
FIG. 2A is an enlarged partial plan view of focus detection pixels according to a first embodiment.
Figure 2B:
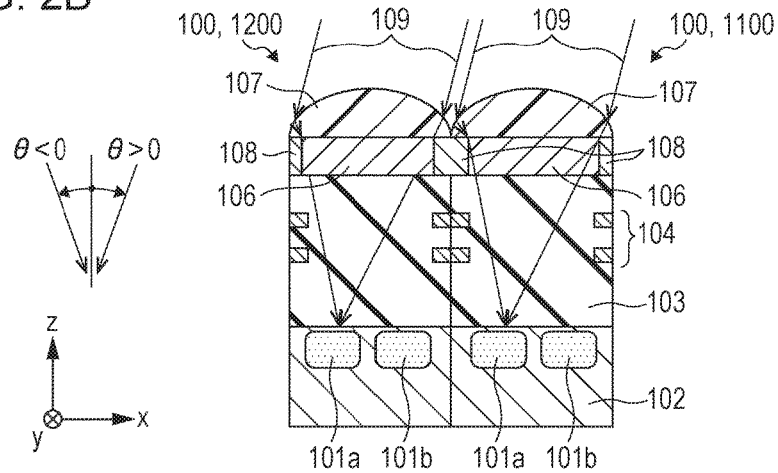
FIG. 2B is a cross-sectional view of the portion in FIG. 2A.

FIG. 2A is an enlarged partial plan view of the pixel area 21 according to the first embodiment, illustrating an example of the arrangement of focus detection pixels 100. FIG. 2B is a cross-sectional view of the portion in FIG. 2A taken along line IIB-11B.

The focus detection pixels 100 each includes a substrate 102 and two photoelectric conversion units 101a and 101b in the substrate 102. A direction in which the two photoelectric conversion units 101a and 101b for use in focus detection are arranged side by side is referred to as an x-direction (a first direction), and a direction perpendicular to the x-direction in a plane parallel to the substrate 102 is referred to as a y-direction (a second direction). A direction which is perpendicular to the surface of the substrate 102 and in which light enters from the substrate 102 side is referred to as a z-direction (a third direction).

In FIG. 2A, among the plurality of focus detection pixels 100, a first pixel 1100 is disposed at the lower right, and a second pixel 1200 is disposed next to the first pixel 1100 in the x-direction. "Disposed next in the x-direction" includes "disposed next in a direction in which the value of the x-coordinate increases" and "disposed next in a direction in which the value of the x-coordinate decreases". A third pixel 1300 is disposed next to the first pixel 1100 in the y-direction. A fourth pixel 1400 is disposed next to the third pixel 1300 in the x-direction and next to the second pixel 1200 in the y-direction.

The pixel area 21 of the solid-state image sensor 10 illustrated in FIG. 1 includes an array of a plurality of focus detection pixels 100. The focus detection pixels 100 can be used for focus detection and also for image capture.

The photoelectric conversion units 101 are formed by implanting impurities deep into the substrate 102. An insulation film 103 is disposed on the substrate 102. The insulating film 103 may be a single layer film composed of one kind of material or a multilayer film in which different materials are layered. An example composition of the layer of the insulation film 103 includes silicon oxide ($SiO_2$), borophosphosilicate glass (BPSG), phosphosilicate glass (PSG), borosilicate glass (BSG), silicon nitride ($Si_3N_4$), and silicon carbide (SiC). The insulation film 103 may have a wire 104 in its interior. The wire 104 may be a multilayer wire. Although FIG. 2B illustrates an example in which the wire 104 is disposed in two layers, the wire 104 may be disposed in three or more layers. The wire 104 may be made of copper, aluminum, tungsten, tantalum, titanium, polysilicon, or another conductive material. Transfer transistors 105 having a MOS transistor structure are disposed on the surface of the semiconductor substrate 102. The transfer transistors 105 are made of polysilicon and are connected to the wire layer 104 via plugs (not shown).

Color filters 106 and micro lenses 107 are disposed on the insulation film 103. The color filters 106 are filters that transmit red (R), green (G), blue (B), cyan (C), magenta (M), or yellow (Y) light. The color filters 106 may be a white (W) filter that transmits light with wavelengths of RGB or CMY or a filter that transmits infrared rays (IR). Using the white (W) filter further increases the sensitivity. The micro lenses 107 are disposed one for each of the photoelectric conversion units 101a and 101b. The micro lenses 107 are made with resin or another material. A planarization layer may be disposed on the color filters 106 because the color filters 106 can vary in thickness.

Light Reflecting Member

As shown in FIG. 2B, a light reflecting member 108 is disposed between the color filter 106 of the first pixel 1100 and the color filter 106 of the second pixel 1200. In other words, the light reflecting member 108 is disposed between the first pixel 1100 and the second pixel 1200.

Referring to the plan view of FIG. 2A, the light reflecting members 108 are disposed in the form of a grid. A portion of the light reflecting member 108 disposed between the first pixel 1100 and the third pixel 1300 and between the second pixel 1200 and the fourth pixel 1400 and extending in the first direction is referred to as a first light reflecting member. Likewise, a portion of the light reflecting member 108 disposed between the first pixel 1100 and the second pixel 1200 and between the third pixel 1300 and the fourth pixel 1400 and extending in the second direction is referred to as a second light reflecting member. The light reflecting member 108 has an area in which the first light reflecting member and the second light reflecting member intersect to each other. This intersecting area includes the first light reflecting member and the second light reflecting member.

The light reflecting members 108 have the function of preventing light from entering adjacent pixels by reflecting light to reduce mixture of colors. For example, the light reflecting members 108 are made of a material having a lower refractive index than the refractive index of the color filters 106. This allows incident light to be reflected by the interface between the light reflecting members 108 and the color filters 106. Examples of the low-refractive material include silicon oxide (SiO), gas, such as air, and vacuum.

The light reflecting members 108 may be made of metal. Examples of the metal include copper, aluminum, and tungsten. The light reflecting member 108 may be composed of a low-refractive material and metal. For example, light reflecting members 108 arranged in the x-direction may be made of a low-refractive material, and light reflecting members 108 arranged in the y-direction may be made of metal.

FIG. 2A illustrates the arrangement of the photoelectric conversion units 101a and 101b, the transfer transistors 105, and the light reflecting members 108 in an x-y plane, in which the micro lenses 107 and the wire 104 are not shown. The light reflecting members 108 flank the color filter 106 to prevent mixture of colors into adjacent pixels, thereby enhancing the performance of image capture. This embodiment is configured to satisfy Exp. (1).

$$W2<W1 \qquad \text{Exp. (1)}$$

where W1 is the interval in the x-direction between adjacent light reflecting members 108 of the plurality of light reflecting members 108 extending in the y-direction, and W2 is the interval in the y-direction between adjacent light reflecting members 108 of the plurality of light reflecting members 108 extending in the x-direction.

Method for Detecting Focus

A method for detecting focus (pupil division) in a focus detection pixel 100 including two photoelectric conversion units 101 will now be described.

Figure 3:
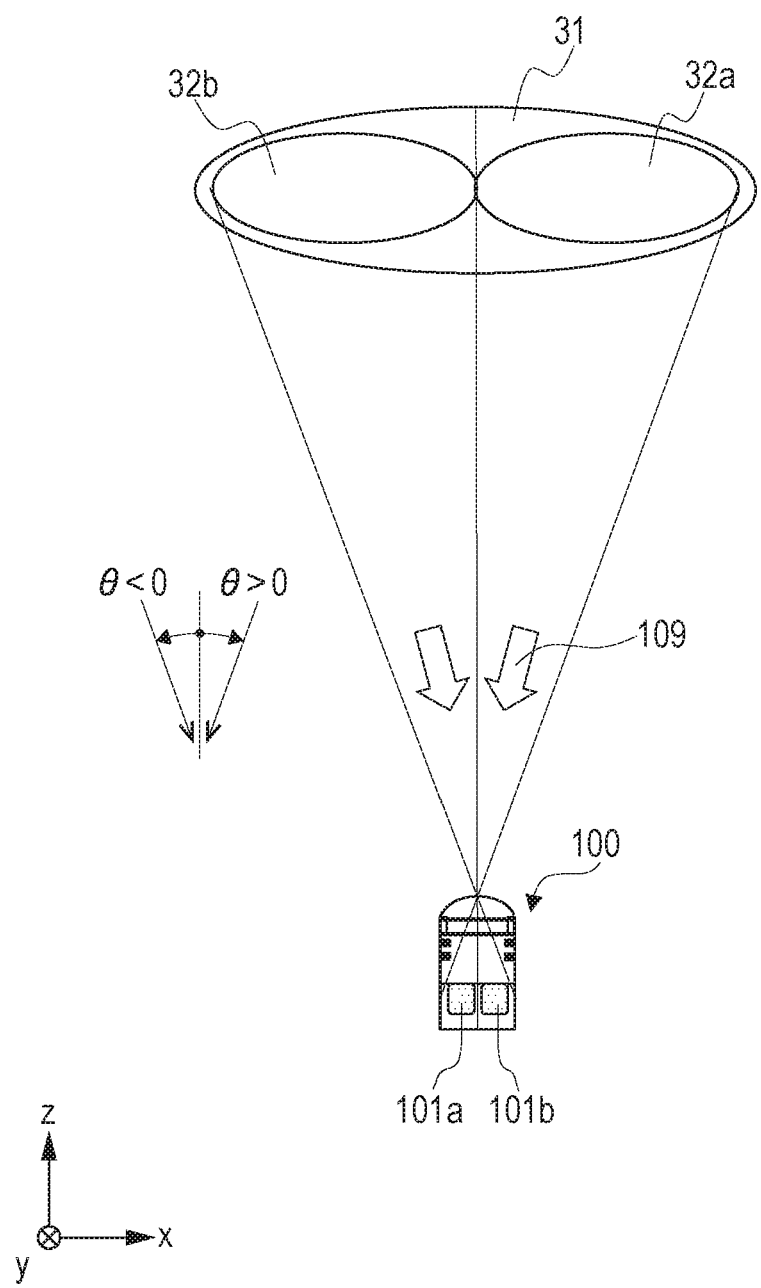
FIG. 3 is a diagram illustrating an exit pupil of light incident on the solid-state image sensor.

FIG. 3 is a schematic diagram of a focus detection pixel 100 and its optical system. Reference sign 31 shown in FIG. 3 denotes an exit pupil of the optical system of the focus detection pixel 100. The exit pupil 31 is divided in the x-direction, and the divided areas of the exit pupil 31 are referred to as pupil areas 32a and 32b. Light 109 that has passed through the pupil areas 32a and 32b is respectively assigned to two photoelectric conversion units 101a and 101b to enable focus detection in the pixel area 21.

Figure 2C:
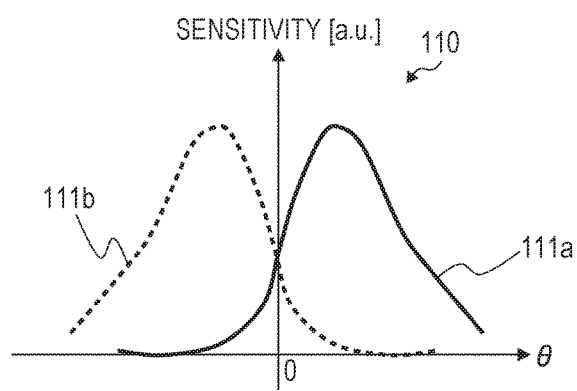
FIG. 2C is a graph of the incidence angle characteristics of the focus detection pixels according to the first embodiment.

FIG. 2B illustrates a state in which the light 109 enters the focus detection pixels 100. FIG. 2C illustrates the incidence angle characteristics 110 of the focus detection pixels 100 with respect to the x-direction. The horizontal axis in FIG. 2C indicates the incidence angle θ of the light 109 in FIG. 2B, and the vertical axis indicates the sensitivity [a.u]. Reference signs 111a and 111b respectively indicate the relationship between the incidence angles of the photoelectric conversion units 101a and 101b and their sensitivity (incidence angle characteristics). The light 109 from the exit pupil 32a in FIG. 3 corresponds to the incidence angle characteristic 111a of the photoelectric conversion unit 101a, and the light 109 from the exit pupil 32b corresponds to the incidence angle characteristic 111b of the photoelectric conversion unit 101b.

Comparative Example

Figure 4A:
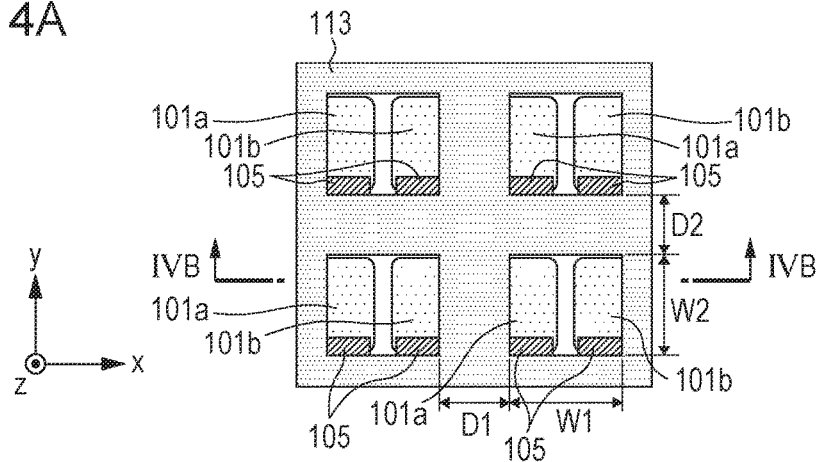
FIG. 4A is an enlarged partial plan view of focus detection pixels of a comparative example.
Figure 4B:
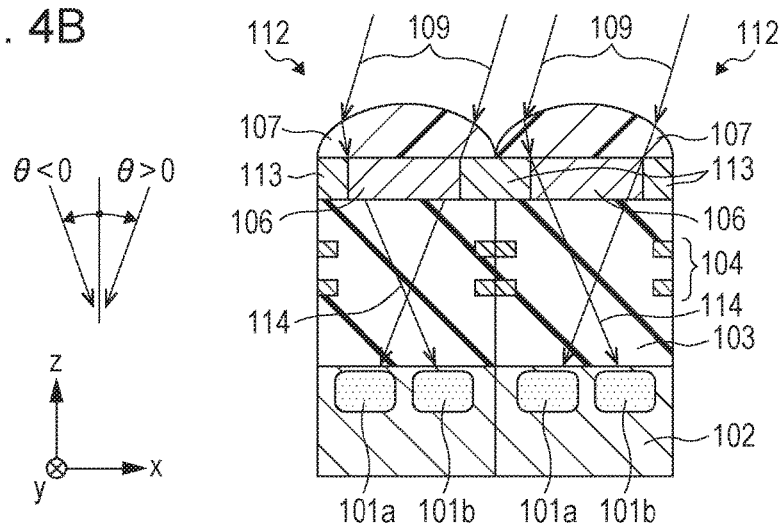
FIG. 4B is a cross-sectional view of the portion in FIG. 4A.
Figure 4C:
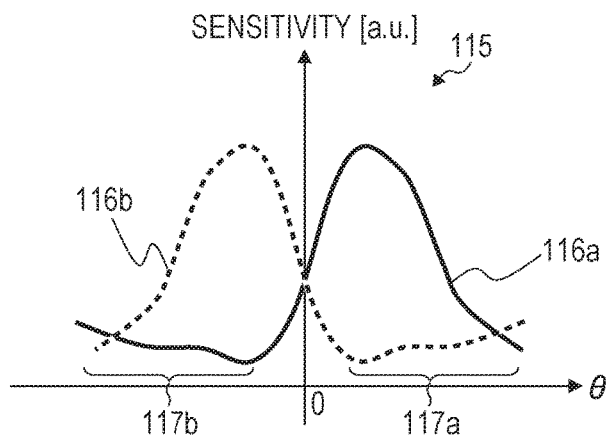
FIG. 4C is a graph of the incidence angle characteristics of the focus detection pixels of the comparative example.

FIGS. 4A to 4C illustrate focus detection pixels 112 including light reflecting members 113 of a comparative example. An interval W1 in the x-direction between adjacent light reflecting members 113 in FIG. 4A and an interval W2 in the y-direction between adjacent light reflecting members 113 satisfy Exp. (2).

$$W2=W1 \qquad \text{Exp. (2)}$$

FIG. 4C illustrates the incidence angle characteristics 115 of the focus detection pixels 112 with respect to the x-direction in the comparative example. The horizontal axis indicates the incidence angle θ of the light 109 in FIG. 4B, and the vertical axis indicates the sensitivity [a.u]. Reference signs 116a and 116b respectively indicate the incidence angle characteristics of the photoelectric conversion units 101a and 101b.

As shown in FIG. 4B, when the light 109 enters at an incidence angle of θ>0, part of the light 109 refracted by the micro lens 107 is reflected by the light reflecting member 113 into light 114. At that time, the light 109 incident at an angle of θ>0, which would enter the photoelectric conversion unit 101a, is partly reflected by the light reflecting member 113 into the photoelectric conversion unit 101b. This increases the sensitivity of an area 117b of the incidence angle characteristic 116b in FIG. 4C.

Similarly, the light 109 incident at an angle θ<0, which would enter the photoelectric conversion unit 101b, is partly reflected by the light reflecting member 113 into the photoelectric conversion unit 101a. This increases the sensitivity of an area 117a of the incidence angle characteristic 116a in FIG. 4C.

The increase in sensitivity causes aliasing for focus detection, and therefore degrades the focus detection performance of the focus detection pixels 112 of the comparative example.

In contrast, this embodiment is configured such that W1 is larger than W2, as expressed by Exp. (1), and therefore reflection of incident light with the light reflecting member 108 is reduced, allowing providing sufficient focus detection performance. Furthermore, the presence of the light reflecting members 108 allows reduction of mixture of colors to adjacent pixels as compared with a configuration without the light reflecting member 108.

In one embodiment, Exp. (3) and Exp. (4) are satisfied.

$$\tfrac{3}{4}P \leq W1 \qquad \text{Exp. (3)}$$

$$W2 \leq \tfrac{7}{8}P \qquad \text{Exp. (4)}$$

where P is the pitch of the pixels in the x-direction and the y-direction.

Specifically, the light reflecting member 108 between pixels adjacent in the x-direction can be small in width by satisfying Exp. (3), thereby reducing reflection of light condensed by the micro lenses 107 from the light reflecting member 108 in the vicinity of the color filters 108. This reduces degradation of the focus detection performance.

By satisfying Exp. (4), the light reflecting member 108 between pixels adjacent in the y-direction can be large in width, thereby reducing mixture of colors to the adjacent pixels.

Exp. (5) may be satisfied.

$$D1<D2 \qquad \text{Exp. (5)}$$

where D1 is the width in the x-direction of the light reflecting member 108 extending in the y-direction, and D2 is the width in the y-direction of the light reflecting member 108 extending in the in the x-direction D1.

In this embodiment, the pitch P of the pixels is the same in the x-direction and in the y-direction. Therefore, if Exp. (5) is satisfied, Exp. (1) is also satisfied. Furthermore, the gate electrodes of the transfer transistors 105 are symmetrical about the y-direction, as shown in FIG. 2A. This allows the incidence angle characteristics 111a and 111b shown in FIG. 2C to be substantially symmetrical, thereby enhancing the focus detection performance.

In this embodiment, the photoelectric conversion units 101a and 101b are arranged in the x-direction, as shown in FIG. 2A to perform focus detection in the x-direction. Alternatively, the photoelectric conversion units 101a and 101b may be arranged in the y-direction to perform focus detection in the y-direction. In this case, the first direction is the y-direction, and the second direction is the x-direction. The focus detection pixels 100 for focus detection in the x-direction and the focus detection pixels 100 for focus detection in the y-direction may be mixed.

Second Embodiment

In the first embodiment, the focus detection pixels 100 are disposed in the entire pixel area 21. In contrast, in this embodiment, both of imaging pixels having no focus detection function and focus detection pixels for image capture are disposed in the pixel area 21. The focus detection pixels may be used as pixels only for focus detection or pixels for both of focus detection and image capture.

Figure 5A:
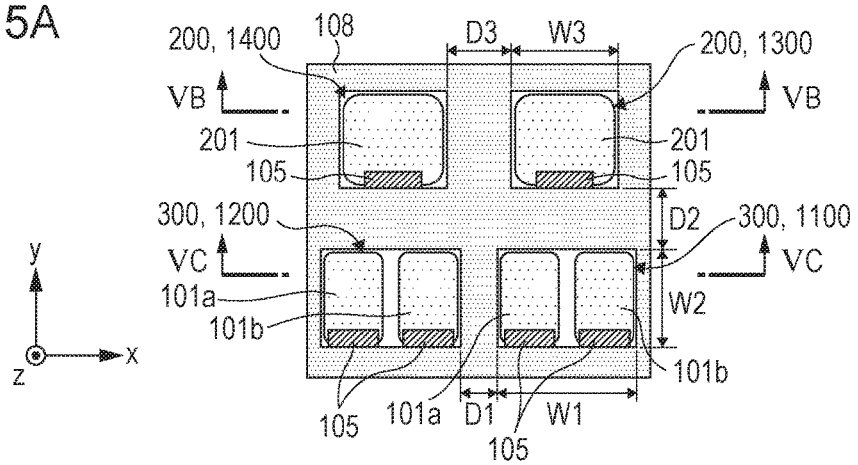
FIG. 5A is an enlarged partial plan view of focus detection pixels according to a second embodiment.

FIG. 5A is an enlarged plan view of part of the pixel area according to this embodiment. The pixel area includes imaging pixels 200 each including one photoelectric conversion unit 201 and focus detection pixels 300 each including two photoelectric conversion units 101*a* and 101*b*. The focus detection pixels 300 are arranged in the x-direction at lower positions as a first pixel and a second pixel. The imaging pixels 200 are arranged in the x-direction at upper positions as a third pixel and a fourth pixel.

Figure 5B:
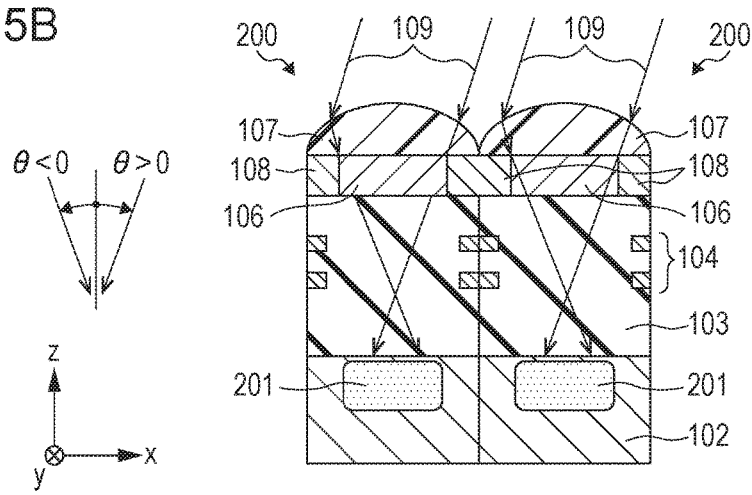
FIG. 5B is a cross-sectional view of the portion in FIG. 5A.
Figure 5C:
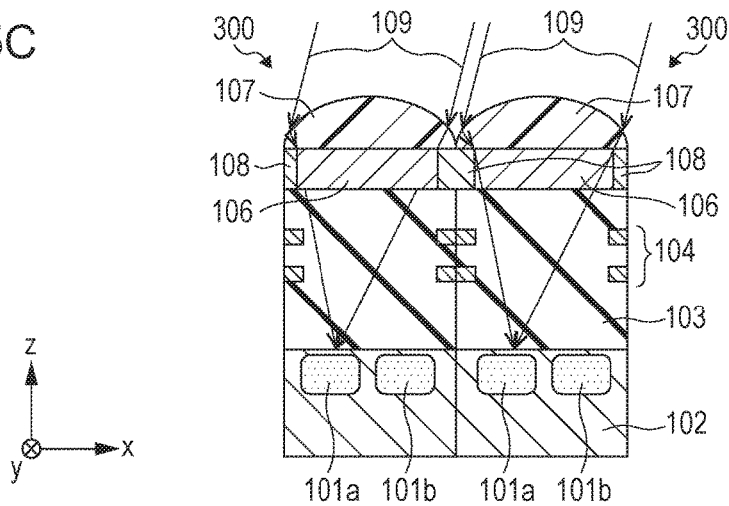
FIG. 5C is a cross-sectional view of the portion in FIG. 5A.

FIG. 5B is a cross-sectional view taken along line VB-VB in FIG. 5A, and FIG. 5C is a cross-sectional view taken along line VC-VC in FIG. 5A.

This embodiment is configured to satisfy Exp. (1), Exp. (5), and Exp. (6).

$$W3 < W1 \qquad \text{Exp. (6)}$$

where W1 is the interval between adjacent light reflecting members 108 of the light reflecting members 108 extending in the y-direction of each focus detection pixel 300, W2 is the interval between adjacent light reflecting members 108 of the light reflecting members 108 extending in the x-direction of each focus detection pixel 300, and W3 is the interval between adjacent light reflecting members 108 of the light reflecting members 108 extending in the y-direction of each imaging pixel 200.

By setting W1 larger than W3, the widths of the light reflecting members 108 extending in the y-direction are smaller between the focus detection pixels 300 than between the imaging pixels 200. In the interval between the focus detection pixels 300, reflection of incident light 109 from the light reflecting members 108 is reduced, ensuring sufficient focus detection performance. In the interval between the imaging pixels 200, mixture of colors to adjacent pixels can be reduced.

In this embodiment, the imaging pixels 200 and the focus detection pixels 300 may be arranged as shown in the plan views of FIGS. 6A and 6B. Specifically, as shown in FIG. 6A, one row of the imaging pixels 200 may be replaced with the focus detection pixels 300. Alternatively, as shown in FIG. 6B, a plurality of focus detection pixels 300 may be spotted in the area over which the imaging pixels 200 are disposed.

This embodiment is configured to satisfy Exp. (7).

$$D1 < D3 \qquad \text{Exp. (7)}$$

where, referring to FIG. 5A and FIGS. 6A and 6B, D3 is the width in the x-direction of the light reflecting member 108 disposed between the imaging pixels 200 and extending in the y-direction, and D1 is the width in the x-direction of the light reflecting member 108 disposed between the focus detection pixels 300 and extending in the y-direction.

In FIGS. 5A to 5C and FIGS. 6A and 6B, the pitch of the focus detection pixels 300 and the pitch of the imaging pixels 200 are equal in the x-direction. Therefore, if Exp. (7) is satisfied for the widths of the light reflecting members 108 in the x-direction, Exp. (6) is also satisfied.

As a further alternative, the imaging pixels 200, the focus detection pixels 300, and the light reflecting members 108 may be disposed as shown in FIG. 7A. In the dispositions shown in FIGS. 6A and 6B, both ends of each of the light reflecting members 108 of the imaging pixels 200 extending in the y-direction and both ends of each of the light reflecting members 108 of the focus detection pixels 300 extending in the y-direction are disposed at different positions. In contrast, in FIG. 7A, one end of each of the light reflecting members 108 of the imaging pixels 200 extending in the y-direction and one end of each of the light reflecting members 108 of the focus detection pixels 300 extending in the y-direction coincide to form a straight line. In contrast, in the configuration shown in FIG. 6B, an imaging pixel 210 adjacent in the x-direction to the focus detection pixel 300 and an imaging pixel 220 that is not adjacent to the focus detection pixel 300 differ in width in the x-direction. For this reason, reducing the variations among the pixels may require devising the layout and signal processing. In contrast, the configuration shown in FIG. 7A allows the widths in the x-direction of all of the imaging pixels 200 to be equal.

As a further alternative, the widths in the x-direction of the light reflecting members 108 extending in the y-direction may be equal in plain view, as shown in FIG. 7B. This configuration satisfy Exp. (8) as well as Exp. (1).

$$W1 = W3 \qquad \text{Exp. (8)}$$

where, for the focus detection pixel 300, W1 is the interval in the x-direction between adjacent light reflecting members 108 extending in the y-direction, W2 is the interval in the y-direction between adjacent light reflecting members 108 extending in the x-direction, and for the imaging pixel 200, W3 is the interval in the x-direction between adjacent light reflecting members 108 extending in the y-direction.

A configuration in which W1 is larger than W3, as shown in FIG. 8, is available, that is, a configuration that satisfies Exp. (6). With this configuration, the interval between the light reflecting members 108 for the focus detection pixel 300 can be further increased, providing enhanced focus detection performance also for light incident at wide angles.

The material of the light reflecting members 108 may be selected as appropriate from the materials described in the first embodiment. The light reflecting members 108 disposed around the focus detection pixels 300 and the light reflecting members 108 disposed around the imaging pixels 200 may be made of different materials. For example, the light reflecting members 108 adjacent in the x-direction to the focus detection pixels 300 may be made of a low-refractive material, and the light reflecting members 108 adjacent in the x-direction to the imaging pixel 200 may be made of metal.

Third Embodiment

Figure 9A:
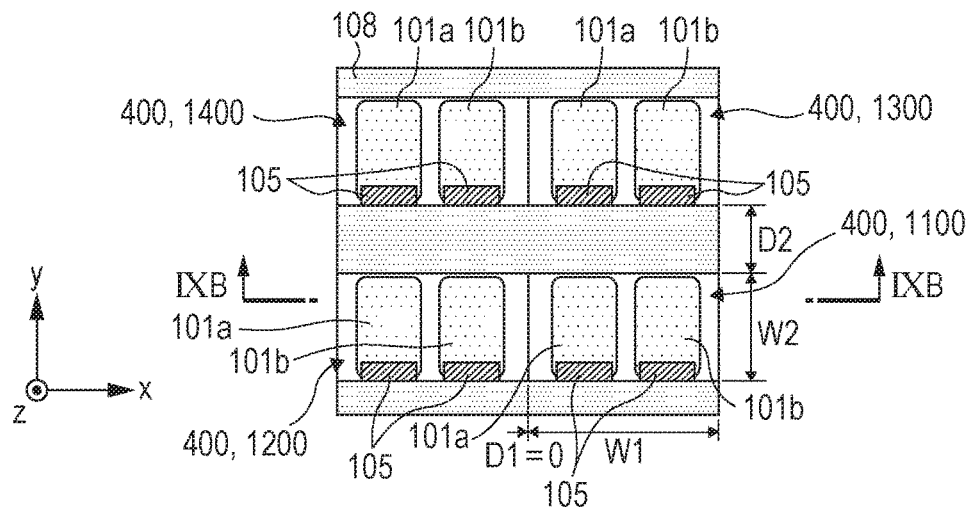
FIG. 9A is a plan view of focus detection pixels according to a third embodiment.
Figure 9B:
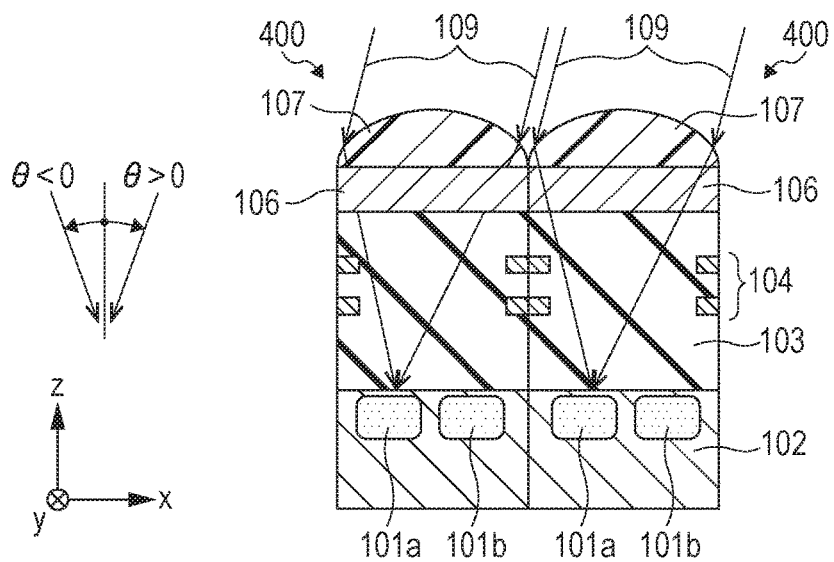
FIG. 9B is a cross-sectional view of the portion in FIG. 9A.

FIGS. 9A and 9B illustrate focus detection pixels 400 of a third embodiment. As compared with FIG. 2A of the first embodiment, this embodiment does not include the light reflecting members 108 extending in the y-direction. In other words, this embodiment is configured to satisfy Exp. (1) and Exp. (9).

$$D1 = 0 \qquad \text{Exp. (9)}$$

Therefore, W1 corresponds to the width of each focus detection pixel 400 in the x-direction. The focus detection pixels 400 each include two photoelectric conversion units 101*a* and 101*b* and can be used as pixels having both of a focus detecting function and an imaging function. Since this configuration does not include the light reflecting members 108 extending in the y-direction, reflection of light incident at wide angles at the peripheral portion of the pixel area 21 from the light reflecting members 108, providing sufficient focus detection performance. Furthermore, this configuration includes the light reflecting members 108 extending in the x-direction. This reduces mixture of colors into adjacent pixels as compared with a configuration without the light reflecting members 108.

Figure 10A:
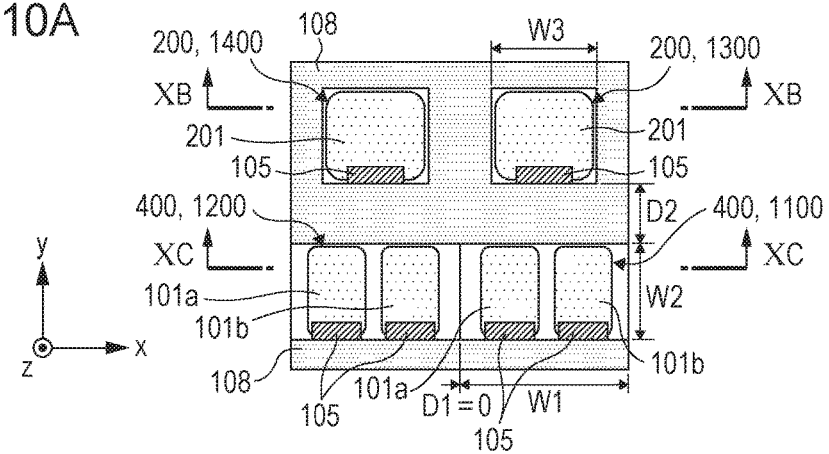
FIG. 10A is a plan view of focus detection pixels according to the third embodiment.
Figure 10B:
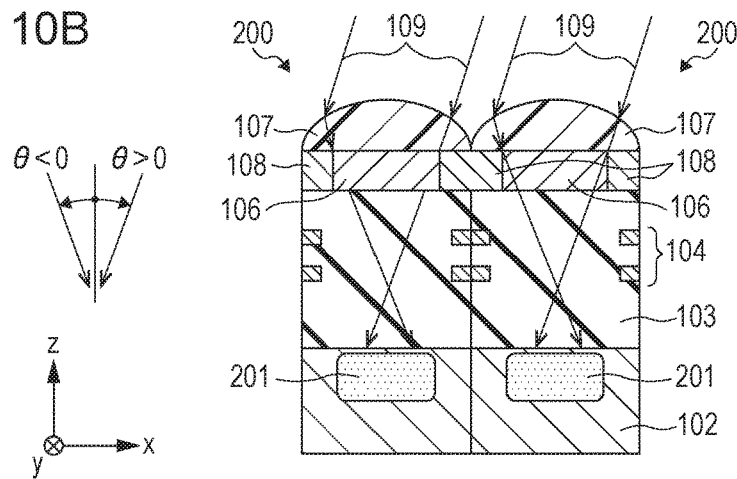
FIG. 10B is a cross-sectional view of the portion in FIG. 10A.
Figure 10C:
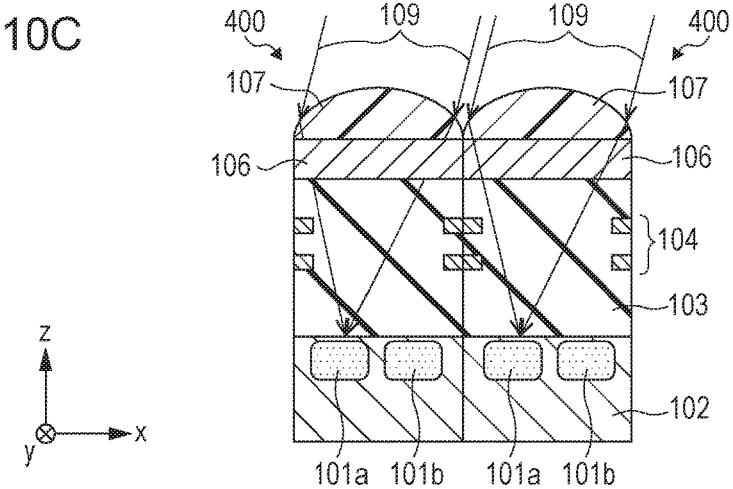
FIG. 10C is a cross-sectional view of the portion in FIG. 10A.

FIG. 10A is a plan view of a pixel area 21 including both of the imaging pixel 200 and the focus detection pixel 400. FIG. 10B is a cross-sectional view taken along line XB-XB in FIG. 10A, illustrating an area in which the imaging pixel 200 are arrayed. FIG. 10C is a cross-sectional view taken along line XC-XC in FIG. 10A, illustrating an area in which focus detection pixels 400 are disposed. As shown in FIGS. 10A to 10C, the focus detection pixels 400 each including two photoelectric conversion units 101a and 101b and the imaging pixels 200 that do not perform focus detection may be mixed in the pixel area 21. Although FIG. 10A illustrates an example in which the imaging pixels 200 each include a single photoelectric conversion unit 201, the imaging pixels 200 may each include a plurality of photoelectric conversion units.

The focus detection pixels 400 may be used as pixels having both of the function of focus detection and the function of image capture.

This embodiment is configured to satisfy Exp. (1), Exp. (6) and Exp. (9) for W1, W2, and W3.

By satisfying Exp. (9), reflection of light incident at wide angles at the peripheral portion of the pixel area 21 from the light reflecting members 108 can be reduced, providing sufficient focus detection performance.

The imaging pixels 200 and the focus detection pixels 400 may be disposed as in the plan views shown in FIGS. 11A and 11B and FIG. 12. Specifically, as shown in FIG. 11A, one row of the imaging pixels 200 may be replaced with the focus detection pixels 400. As an alternative, a plurality of focus detection pixels 400 may be spotted in the area over which the imaging pixels 200 are disposed, as shown in FIG. 11B. As a further alternative, the light reflecting members 108 are not disposed around the focus detection pixels 400, as shown in FIG. 12. Disposing an area in which the light reflecting member 108 are not disposed around the focus detection pixels 400 reduces reflection of light incident at wide angles from the light reflecting members 108, providing sufficient focus detection performance. Disposing the light reflecting members 108 around the imaging pixels 200 prevents mixture of colors into adjacent pixels.

The configurations of FIGS. 11A and 11B and FIG. 12 satisfy Exp. (5) and Exp. (7), that is, D2 is larger than D1, and D3 is larger than D1, where D1 is the width in the x-direction of the light reflecting member 108 disposed between two focus detection pixels 400 adjacent in the x-direction and extending in the y-direction, D2 is the width in the y-direction of the light reflecting member 108 disposed between two imaging pixels 200 adjacent in the y-direction and extending in the x-direction, and D3 is the width in the x-direction of the light reflecting member 108 disposed between two imaging pixels 200 adjacent in the x-direction and extending in the y-direction.

In the configurations shown in FIGS. 11A and 11B and FIG. 12, the pitch of the imaging pixels 200 in the x-direction and the pitch of the imaging pixels 200 in the y-direction are the same, and therefore Exp. (1) is satisfied by satisfying Exp. (5). In other words, the relation, W2<W1, is satisfied. By satisfying Exp. (7), Exp. (6) is satisfied, in other words, the relation, W3<W1 is satisfied.

Fourth Embodiment

Figure 13:
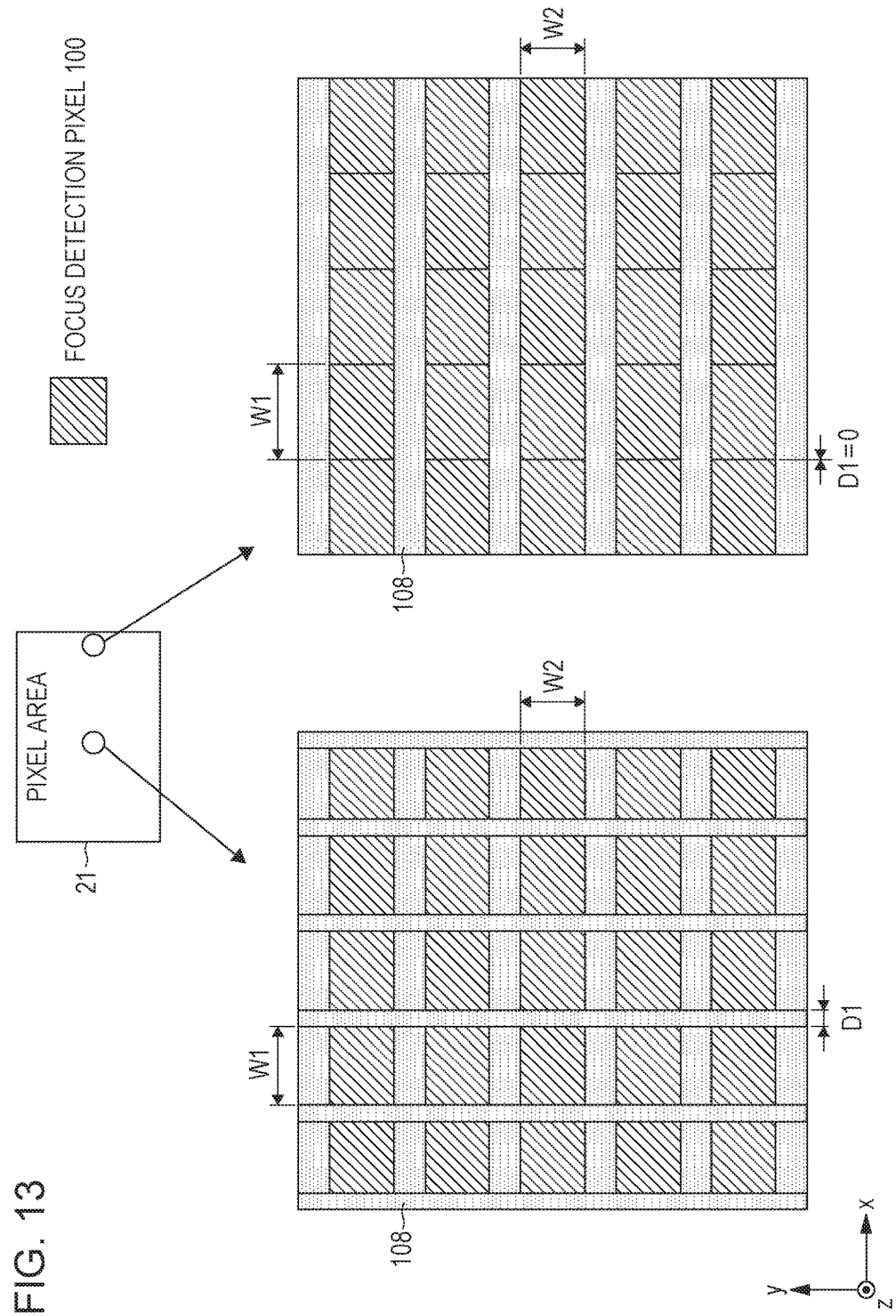
FIG. 13 is a plan view of focus detection pixels according to a fourth embodiment.

A fourth embodiment will be described with reference to FIGS. 13 and 14. FIG. 13 illustrates a configuration in which the focus detection pixels 100 are disposed over the pixel area 21, as described in the first embodiment. FIG. 14 illustrates a configuration in which the focus detection pixels 300 and the imaging pixels 200 are disposed in mixture, as described in the second embodiment.

What the configurations shown in FIG. 13 and FIG. 14 have in common is that among the light reflecting members 108 extending in the y-direction, the interval W1 in the x-direction of adjacent light reflecting members 108 differ between in the center and in the peripheral portion of the pixel area 21. In other words, the interval W1 in the peripheral portion is larger than the interval W1 in the center. For the width D1 in the x-direction of the light reflecting member 108 extending in the y-direction, the width D1 in the peripheral portion is smaller than the width D1 in the center. This ensures sufficient focus detection performance for light incident at wide angles, which is especially pronounced in the peripheral portion of the pixel area 21, and further reduces mixture of color to adjacent pixels in the center.

Fifth Embodiment

Figure 15A:
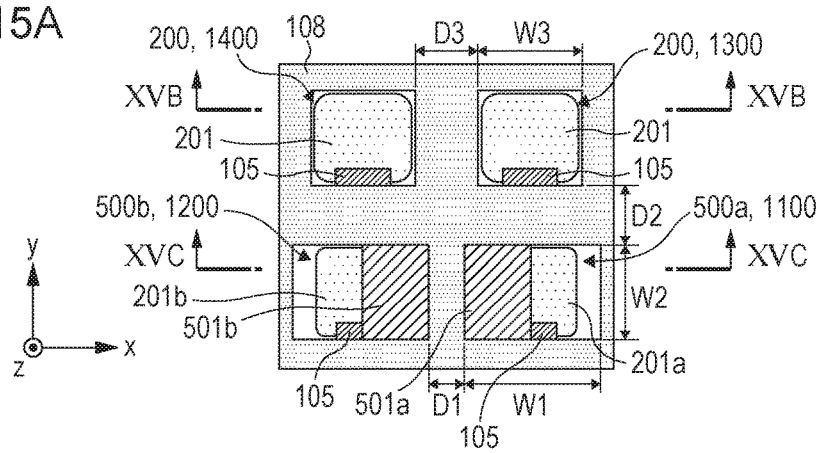
FIG. 15A is a plan view of focus detection pixels according to a fifth embodiment.
Figure 15B:
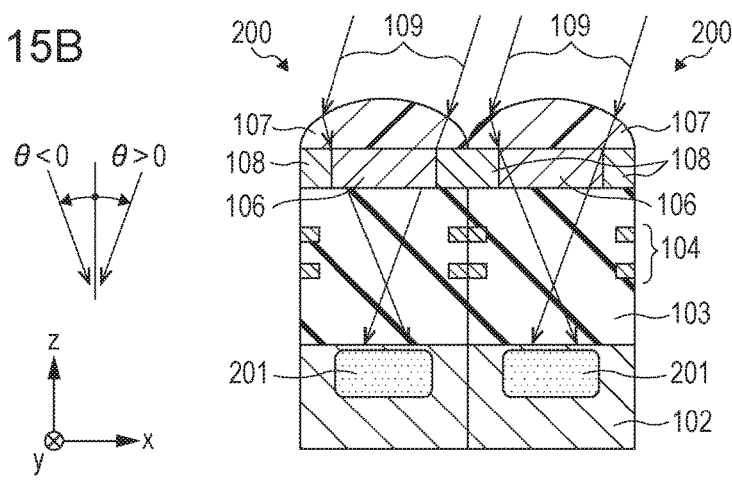
FIG. 15B is a cross-sectional view of the portion in FIG. 15A.
Figure 15C:
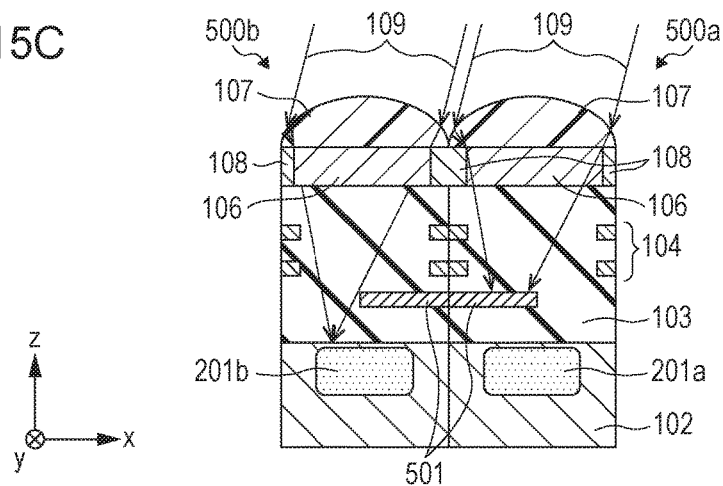
FIG. 15C is a cross-sectional view of the portion in FIG. 15A.

FIGS. 15A to 15C illustrate focus detection pixels 500a and 500b according to a fifth embodiment. The focus detection pixel 500a includes a light shielding portion 501a (501) that covers the left half of a photoelectric conversion unit 201a, and a focus detection pixel 500b includes a light shielding portion 501b (501) that covers the right half of a photoelectric conversion unit 201b. In other words, for the first pixel 1100, the light shielding portion 501a extends to cover a portion of the photoelectric conversion unit 201a from the substantial center of the photoelectric conversion unit 201a to the second pixel 1200, and for the second pixel 1200, the light shielding portion 501b extends to cover a portion of the photoelectric conversion unit 201b from a substantial center of the photoelectric conversion unit 201b to the first pixel 1100.

Although the light shielding portion 501 in FIGS. 15A and 15C is disposed below the wire layer 104, the light shielding portion 501 may also serve as the wire layer 104 or may be disposed in the wire layer 104. Alternatively, the light shielding portion 501 may be disposed in contact with the substrate 102. The light reflecting members 108 of this embodiment is configured to satisfy Exp. (1), where W1 is the interval in the x-direction between adjacent light reflecting members 108 extending in the y-direction, and W2 is the interval in the y-direction between adjacent light reflecting members 108 extending in the x-direction. In other words, this embodiment is configured such that W2 is smaller than W1.

Focus detection is enabled by respectively assigning the light 109 that has passed through the pupil areas 32a and 32b shown in FIG. 3 to the focus detection pixels 501a and 501b. The intensities of incident light 19 relative to the incidence angles in the focus detection pixels 500a and 500b are respectively expressed as the distribution of the incidence angle characteristics 111a and 111b shown in FIG. 2C. By satisfying Exp. (1), sufficient focus detection performance can be provided, as in the above embodiments.

The configuration of this embodiment can also be applied to the configuration in which the focus detection pixels and the imaging pixels are mixed, described above.

Sixth Embodiment

Figure 16A:
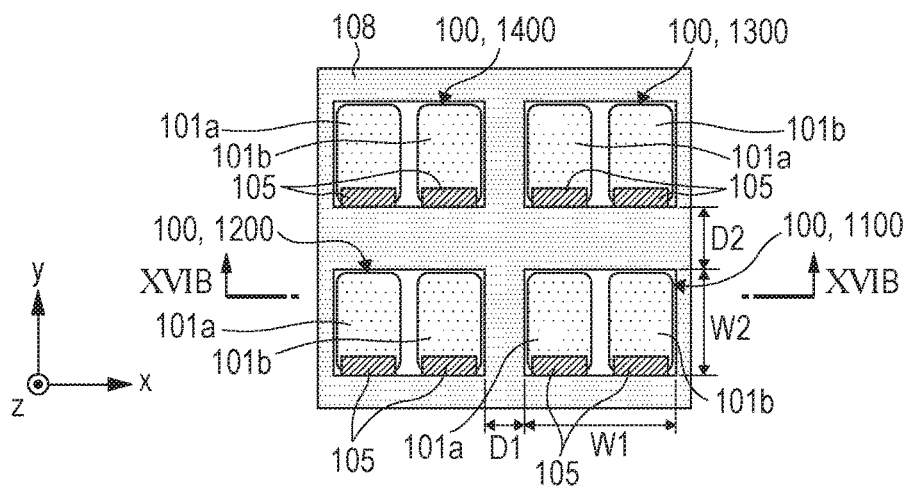
FIG. 16A is a plan view of focus detection pixels according to a sixth embodiment.
Figure 16B:
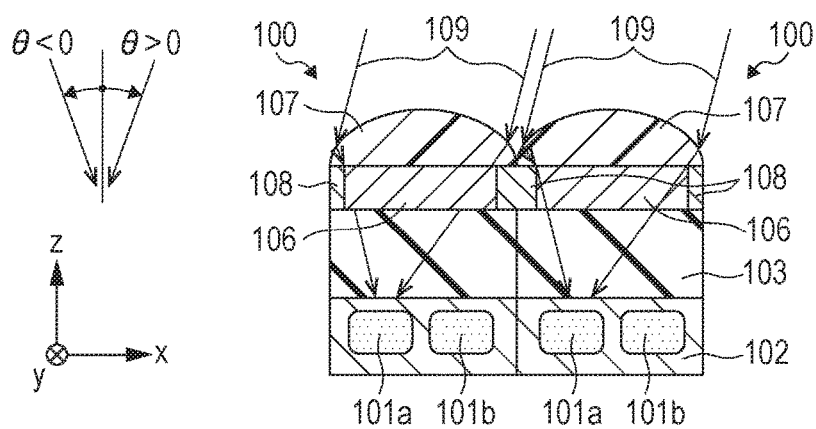
FIG. 16B is a cross-sectional view of the portion in FIG. 16A.
Figure 17A:
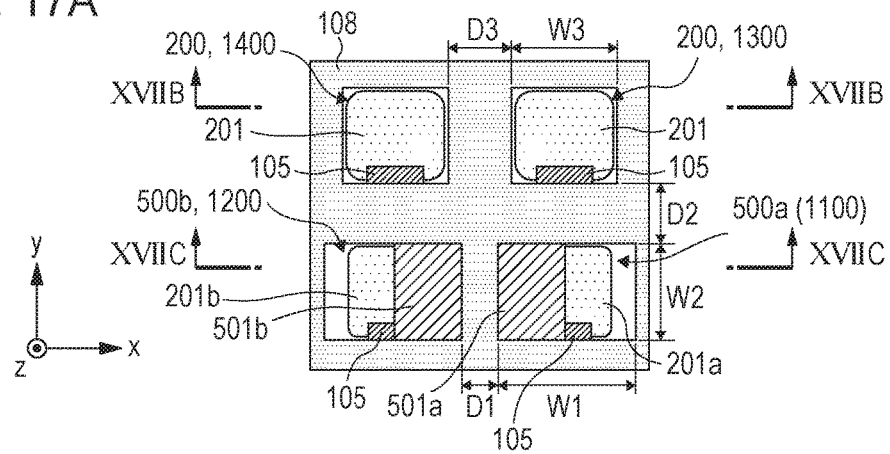
FIG. 17A is a plan view of focus detection pixels according to the sixth embodiment.
Figure 17B:
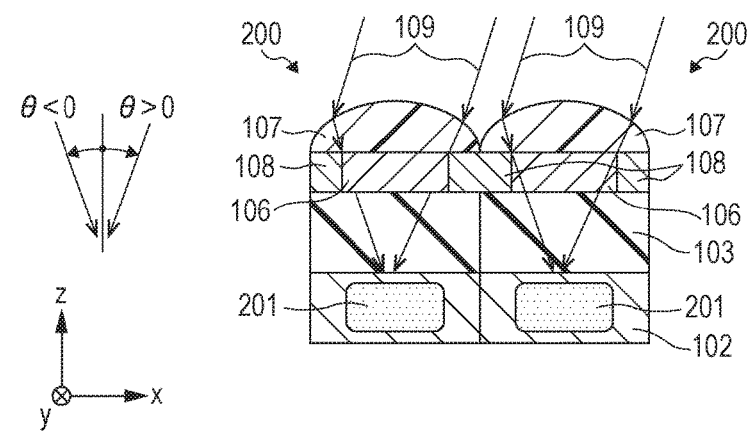
FIG. 17B is a cross-sectional view of the portion in FIG. 17A.
Figure 17C:
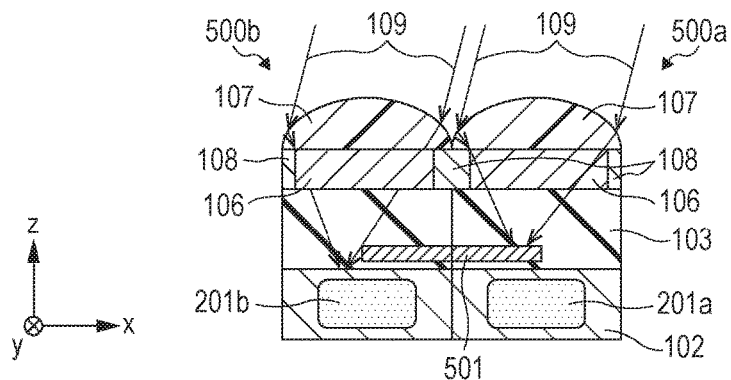
FIG. 17C is a cross-sectional view of the portion in FIG. 17A.

A sixth embodiment will be described with reference to FIGS. 16A and 16B and FIGS. 17A to 17C. This embodiment is characterized by having a so-called backside-illumination configuration. FIGS. 16A and 16B illustrate an example in which the configuration of the first embodiment is replaced with the configuration of backside illumination. FIGS. 17A to 17C illustrate an example in which the configuration of the fifth embodiment is replaced with the configuration of backside illumination. The configuration of backside illumination further enhances the sensitivity. The light reflecting members 108 may adopt the configurations described in the above embodiments as appropriate.

Another Embodiment

This embodiment is an embodiment of a camera system that uses a solid-state image sensor including the focus detection pixels described in the above embodiments.

FIG. 18 illustrates the configuration of an image capturing system 1, such as a digital still camera and a video camera. The image capturing system 1 has a taking lens serving as an imaging optical system 11 for forming an image of a subject. The imaging optical system 11 including the taking lens controls the focal position with a lens control unit 12. A diaphragm 13 is connected to a diaphragm control unit 14 and has the function of adjusting the intensity of light by changing in aperture diameter (changing the aperture value). In the imaging space of the imaging optical system 11, an imaging plane of a solid-state image sensor 10 that photoelectrically converts a subject image formed by the imaging optical system 11 is disposed. The solid-state image sensor 10 includes a CMOS sensor and its peripheral circuit. A camera CPU 15 is a controller that controls the various operations of the camera. The camera CPU 15 includes an operating unit, a ROM, a RAM, an analog-to-digital converter, a digital-to-analog converter, and a communication interface circuit. The camera CPU 15 controls the operation of the components of the camera according to computer programs stored in the ROM to cause the camera to execute a series of image capturing operations, such as auto focusing, image capturing, image processing, and recording, including detection of the focus state of the imaging optical system 11 (focus detection). The camera CPU 15 corresponds to an operating unit.

An image-sensor control unit 16 controls the operation of the solid-state image sensor 10 and converts a pixel signal (an imaging signal) output from the solid-state image sensor 10 from analog to digital and transmits the signal to the camera CPU 15. An image processing unit 17 is used to generate an image signal by performing γ-conversion, color interpolation, and other image processing on the imaging signal subjected to analog to digital conversion. A display 18, such as a liquid crystal display (LCD), displays information on the mode of image capturing of the camera, a preview image before image capturing, a check image after image capturing, an in-focus state during focus detection, and so on. Reference sign 19 denotes an operation switch. A detachable storage medium 20 is used to store captured images. The camera CPU 15 selects values output from focus detection pixels with an optimum shape of a plurality of light shielding shapes according the loaded lens and image capturing conditions for focus detection. This allows a camera system with higher focus detection accuracy to be provided according to a variety of lenses.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-118578, filed Jun. 11, 2015, which is hereby incorporated by reference herein in its entirety.

What is claimed is:

1. A solid-state image sensor comprising a pixel area in which a plurality of pixels are disposed in a two dimensional form, the image sensor comprising:
    a first pixel for detecting focus, the first pixel comprising a plurality of photoelectric conversion units disposed in a first direction;
    a second pixel disposed adjacent to the first pixel along the first direction;
    a third pixel disposed adjacent to the first pixel along a second direction perpendicular to the first direction;
    a first light reflecting member disposed between the first pixel and the third pixel and extending in the first direction; and
    a second light reflecting member disposed between the first pixel and the second pixel and extending in the second direction,
    wherein the first light reflecting member has a longer axis in the first direction and a shorter axis in the second direction,
    wherein the second light reflecting member has a longer axis in the second direction and a shorter axis in the first direction, and
    wherein a width of the first light reflecting member in a direction of the shorter axis of the first light reflecting member is larger than a width of the second light reflecting member in a direction of the shorter axis of the second light reflecting member.

2. The solid-state image sensor according to claim 1, wherein the first light reflecting member is disposed between a first color filter of the first pixel and a third color filter of the third pixel.

3. The solid-state image sensor according to claim 1, further comprising:
    a fourth pixel disposed adjacent to the third pixel along the first direction and adjacent to the second pixel along the second direction; and
    a third light reflecting member extending in the second direction between the third pixel and the fourth pixel,
    wherein the third light reflecting member has a longer axis in the second direction and a shorter axis in the first direction,
    wherein the third pixel is a pixel for imaging, and
    wherein a width of the third light reflecting member in the direction of the shorter axis of the third light reflecting member is larger than a width of the second light reflecting member in the direction of the shorter axis of the second light reflecting member.

4. The solid-state image sensor according to claim 1, wherein a width in the first direction of the second light reflecting member disposed in a peripheral portion of the pixel area is smaller than a width in the first direction of the second light reflecting member disposed in a center of the pixel area.

5. The solid-state image sensor according to claim 1, wherein the first light reflecting member has a refractive index lower than a refractive index of a first color filter of the first pixel.

6. The solid-state image sensor according to claim 5, wherein the first light reflecting member comprises silicon oxide or gas.

7. The solid-state image sensor according to claim 1, wherein the first light reflecting member comprises metal.

8. The solid-state image sensor according to claim 7, wherein the first light reflecting member comprises one of copper, aluminum, and tungsten.

\* \* \* \* \*